United States Patent
Fay

(10) Patent No.: US 10,944,435 B1
(45) Date of Patent: Mar. 9, 2021

(54) TEARING SAVE ENCODING

(71) Applicant: NXP B.V., Eindhoven (NL)

(72) Inventor: Björn Fay, Brande-Hörnerkirchen (DE)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 16/832,325

(22) Filed: Mar. 27, 2020

(51) Int. Cl.
*H03M 13/29* (2006.01)
*G06F 11/10* (2006.01)

(52) U.S. Cl.
CPC ..... *H03M 13/2906* (2013.01); *G06F 11/1076* (2013.01)

(58) Field of Classification Search
CPC .................. H03M 13/2906; G06F 11/1076
See application file for complete search history.

(56) References Cited

U.S. PATENT DOCUMENTS

| | | | | |
|---|---|---|---|---|
| 7,149,955 B1* | 12/2006 | Sutardja | ................ | H03M 13/19 714/809 |
| 7,425,907 B1* | 9/2008 | Chaichanavong | .......................... | G11B 20/1426 341/58 |
| 7,783,937 B1* | 8/2010 | Sutardja | ................ | H03M 13/19 714/701 |
| 8,359,498 B1* | 1/2013 | Sutardja | ................ | H04L 1/0054 714/701 |
| 8,499,192 B2 | 7/2013 | Rousseau | | |
| 9,369,486 B2* | 6/2016 | Lewis | ................ | H04L 63/1475 |
| 2006/0007024 A1* | 1/2006 | Tsang | ...................... | H03M 7/00 341/50 |
| 2010/0208894 A1* | 8/2010 | True | ...................... | H04L 9/0637 380/270 |
| 2012/0017136 A1* | 1/2012 | Ordentlich | .......... | G06F 11/1028 714/763 |
| 2012/0131244 A1* | 5/2012 | Abbasfar | ............ | G06F 13/4265 710/105 |
| 2013/0097396 A1* | 4/2013 | Ordentlich | ............. | G11C 16/08 711/154 |
| 2013/0346830 A1* | 12/2013 | Ordentlich | .......... | G06F 11/1048 714/767 |
| 2016/0156476 A1* | 6/2016 | Lee | ......................... | H04L 9/088 380/44 |
| 2016/0352358 A1* | 12/2016 | Ordentlich | ............ | H03M 13/47 |

OTHER PUBLICATIONS

C. Zhang, M. Huang, L. Okamura and T. Yoshihara, "Error rate decrease through Hamming weight change for NAND Flash," 2010 10th International Symposium on Communications and Information Technologies, Tokyo, 2010, pp. 1079-1082. (Year: 2010).*

(Continued)

*Primary Examiner* — Kyle Vallecillo

(57) ABSTRACT

Various embodiments relate to a method and system for encoding data to be stored in a memory, including: encoding the data to be stored in memory with an error detection code (EDC), that can detect up to 4 bit errors, as first encoded data; determining the Hamming weight of the first encoded data; inverting the determined Hamming weight; concatenating the first encoded data and three copies of the inverted Hamming weight as concatenated data; encoding the concatenated data with an error correcting code (ECC), that can correct 1 bit error, as second encoded data; and storing the second encoded data in the memory.

20 Claims, 2 Drawing Sheets

(56) References Cited

OTHER PUBLICATIONS

Irina Petkova Naydenova, "Error Detection and Correction for Symmetric and Asymmetric Channels", Selmer Center, Department of Informatics, University of Bergen, Norway, 104 pages. (Downloaded Mar. 27, 2020).

J. M. Berger, "A note on an error detection code for asymmetric channels". Information and Control. 4 (1): 68-73. (1961).

Mario Blaum, et al., "On t-Error Correcting/All Unidirectional Error Detecting Codes", IEEE Transactions on Computers, vol. 38, No. 11, pp. 1493-1150. (November 1989).

Rajendra S. Katti, et al. "An Improvement on Constructions of t-EC/AUED Codes", IEEE Transactions on Computers, vol. 45, No. 5, pp. 607-608. (May 1996).

* cited by examiner

TEARING SAVE ENCODING

TECHNICAL FIELD

Various exemplary embodiments disclosed herein relate generally to tearing save encoding.

BACKGROUND

When data is written to a memory or the memory is erased and that operation is interrupted, tearing occurs. Tearing can occur in various ways and settings. For example, an RFID chip often receives external power via an RF signal from a reader, and if data is being written to the memory of the RFID chip and the device moves out of range of the power source, the write operation may be interrupted and tearing occurs. A similar situation may occur when the memory is being erased. This tearing can lead to corrupted data in the memory. In other low power and internet of things (IoT) scenarios, such tearing may also occur which leads to data corruption.

SUMMARY

A summary of various exemplary embodiments is presented below. Some simplifications and omissions may be made in the following summary, which is intended to highlight and introduce some aspects of the various exemplary embodiments, but not to limit the scope of the invention. Detailed descriptions of an exemplary embodiment adequate to allow those of ordinary skill in the art to make and use the inventive concepts will follow in later sections.

Various embodiments relate to a method for encoding data to be stored in a memory, including: encoding the data to be stored in memory with an error detection code (EDC), that can detect up to 4 bit errors, as first encoded data; determining the Hamming weight of the first encoded data; inverting the determined Hamming weight; concatenating the first encoded data and three copies of the inverted Hamming weight as concatenated data; encoding the concatenated data with an error correcting code (ECC), that can correct 1 bit error, as second encoded data; and storing the second encoded data in the memory.

Various embodiments are described, further comprising concatenating 2(t−1) additional copies of the inverted Hamming weight to the first concatenated data, wherein t is the number of arbitrary errors to be corrected, and wherein the EDC detects 4t bit errors.

Various embodiments are described, wherein the EDC is a cyclic redundancy code (CRC).

Various embodiments are described, further comprising encoding the three copies of the inverted Hamming weight before being concatenated to the first encoded data, wherein the encoded inverted Hamming weights has fewer bits than the three copies of the inverted Hamming weight and wherein for all higher Hamming weights the encoding should have at least three bit-positions that change from 1 to 0 per Hamming weight.

Various embodiments are described, wherein when the Hamming weight is always even, the last significant bit of the Hamming weight is not used.

Further various embodiments relate to a method for decoding data stored in a memory, including: reading first encoded data from the memory, wherein the first encoded data includes second encoded data encoded with an error detection code (EDC), that can detect up to 4 bit errors, and a first, second, and third inverted Hamming weights; decoding the first encoded data using an error correcting code (ECC); decoding and checking the second encoded data with the EDC; inverting the first, second, and third decoded inverted Hamming weights into first, second, and third Hamming weights; determining a fourth Hamming weight of the second encoded data; returning the decoded data if the checking of the second encoded data did not return an error and the first, second, third, and fourth Hamming weights are equal, otherwise returning an error.

Various embodiments are described, wherein the encoded data further includes 2(t−1) additional copies of the inverted Hamming weight to the first concatenated data, wherein t is the number of arbitrary errors to be corrected, wherein the EDC detects 4t bit errors.

Various embodiments are described, wherein the EDC is a cyclic redundancy code (CRC).

Various embodiments are described, wherein the first, second, and third inverted Hamming weight are encoded, wherein the encoded first, second, and third inverted Hamming weights has fewer bits than the concatenated first, second, and third inverted Hamming weights, further comprising decoding the encoded first, second, and third inverted Hamming weights and wherein for all higher Hamming weights the encoding should have at least three bit-positions that change from 1 to 0 per Hamming weight.

Various embodiments are described, wherein when the Hamming weight is always even, the last significant bit of the Hamming weight is not used.

Further various embodiments relate to a device configured to encode data stored in a first memory, including: a second memory; a processor coupled to the second memory, wherein the processor is further configured to: encode the data to be stored in memory with an error detection code (EDC), that can detect up to 4 bit errors, as first encoded data; determine the Hamming weight of the first encoded data; invert the determined Hamming weight; concatenate the first encoded data and three copies of the inverted Hamming weight as concatenated data; encode the concatenated data with an error correcting code (ECC), that can correct 1 bit error, as second encoded data; and store the second encoded data in the memory.

Various embodiments are described, wherein the processor is further configured to concatenate 2(t−1) additional copies of the inverted Hamming weight to the first concatenated data, wherein t is the number of arbitrary errors to be corrected, and wherein the EDC detects 4t bit errors.

Various embodiments are described, wherein the EDC is a cyclic redundancy code (CRC).

Various embodiments are described, wherein the processor is further configured to encode the three copies of the inverted Hamming weight before being concatenated to the first encoded data, wherein the encoded inverted Hamming weights has fewer bits than the three copies of the inverted Hamming weight and wherein for all higher Hamming weights the encoding should have at least three bit-positions that change from 1 to 0 per Hamming weight.

Various embodiments are described, wherein when the Hamming weight is always even, the last significant bit of the Hamming weight is not used.

Further various embodiments relate to a device configured to decode data stored in a first memory, including: a second memory; a processor coupled to the second memory, wherein the processor is further configured to: read first encoded data from the memory, wherein the first encoded data includes second encoded data encoded with an error detection code (EDC), that can detect up to 4 bit errors, and a first, second, and third inverted Hamming weights; decode the first encoded data using an error correcting code (ECC); decode and checking the second encoded data with the EDC; invert the first, second, and third decoded inverted Hamming weights into first, second, and third Hamming weights; determine a fourth Hamming weight of the second encoded data; return the decoded data if the checking of the second encoded data did not return an error and the first, second, third, and fourth Hamming weights are equal, otherwise returning an error.

Various embodiments are described, wherein the encoded data further includes 2(t−1) additional copies of the inverted Hamming weight to the first concatenated data, wherein t is the number of arbitrary errors to be corrected, wherein the EDC detects 4t bit errors.

Various embodiments are described, wherein the EDC is a cyclic redundancy code (CRC).

Various embodiments are described, wherein the first, second, and third inverted Hamming weight are encoded, wherein the encoded first, second, and third inverted Hamming weights has fewer bits than the concatenated first, second, and third inverted Hamming weights, further comprising decoding the encoded first, second, and third inverted Hamming weights and wherein for all higher Hamming weights the encoding should have at least three bit-positions that change from 1 to 0 per Hamming weight.

Various embodiments are described, wherein when the Hamming weight is always even, the last significant bit of the Hamming weight is not used.

BRIEF DESCRIPTION OF THE DRAWINGS

In order to better understand various exemplary embodiments, reference is made to the accompanying drawings, wherein.

To facilitate understanding, identical reference numerals have been used to designate elements having substantially the same or similar structure and/or substantially the same or similar function.

DETAILED DESCRIPTION

Figure 1:
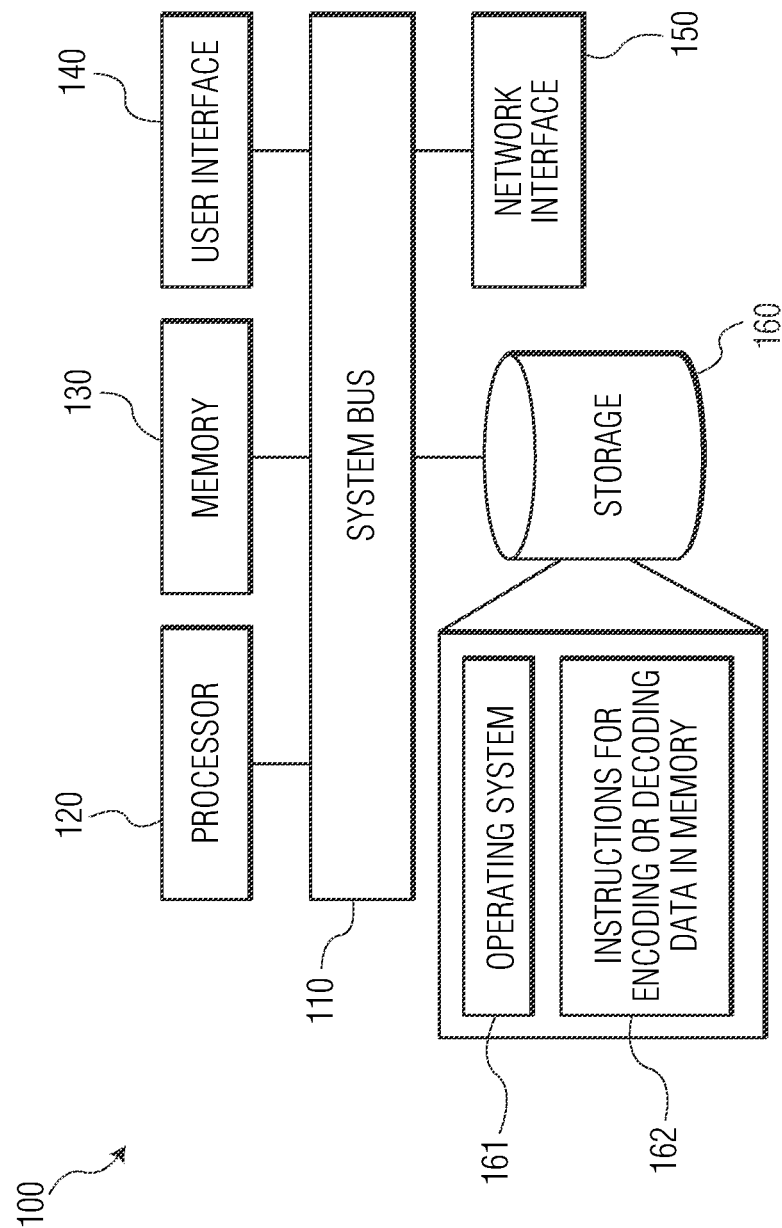
FIG. 1 illustrates an exemplary hardware diagram 100 for implementing a memory encoding and decoding method as described herein.

The description and drawings illustrate the principles of the invention. It will thus be appreciated that those skilled in the art will be able to devise various arrangements that, although not explicitly described or shown herein, embody the principles of the invention and are included within its scope. Furthermore, all examples recited herein are principally intended expressly to be for pedagogical purposes to aid the reader in understanding the principles of the invention and the concepts contributed by the inventor(s) to furthering the art and are to be construed as being without limitation to such specifically recited examples and conditions. Additionally, the term, "or," as used herein, refers to a non-exclusive or (i.e., and/or), unless otherwise indicated (e.g., "or else" or "or in the alternative"). Also, the various embodiments described herein are not necessarily mutually exclusive, as some embodiments can be combined with one or more other embodiments to form new embodiments.

In the world of IoT or RFID devices, but also other scenarios, it is possible that during writing a word to memory or erasing a memory word that power is lost and the operation is teared. In such cases the system should be able to detect this, such that it could retry or repair the issue, depending on the circumstances.

Embodiments will be described that illustrate how memory content may be encoded in a way that it can be written or erased in a tearing-save way. The assumption regarding writing and erasing is that tearing-errors can only happen in one direction, meaning that either not all 1s are programmed, or not all 1s are erased, so a 0-bit could be actually be 1 or 0, but a 1-bit is always a 1, or depending on the polarity of the memory, the other way around. The disclosed memory encoding even works if there is an additional arbitrary one-bit-error and an error correcting code that may correct one bit error. For multiple bit errors the situation is more complex, but it is also possible to correct such errors as well. Likewise, embodiments for decoding such encoded data read from the memory will also be described.

The solution to this problem described herein includes adding an error detection code that is dedicated to unidirectional errors. This may be implemented using an inverted Hamming weight or so-called Berger code. In addition, this will be combined with an error correction code (ECC), that may correct one arbitrary (symmetric) error. Because this may lead to the situation where this ECC wrongly corrects a bit because of multiple tearing errors or rightly corrects an arbitrary error, up to two arbitrary (symmetric) errors after the error correction need to be considered. This situation may be accommodated by adding an error detection code (e.g., CRC) and repeating the inverted Hamming weight three times.

First, the simple case will be examined where only unidirectional errors occur and no additional arbitrary (symmetric) errors occur. In this case errors can only happen in one direction, which means that 1-bits in memory are always 1, but 0-bits could either be 0 or should have been a 1. This could either happen because a 1 was not fully programmed or not all 1-bits have been fully erased. Depending on the polarity of the memory this could also be the other way around (0<=>1), which implies that the scheme could also be used in case where you want to overwrite a memory word with all 1-bits, for example to invalidate this memory word. In this simple case, a Berger code may be used to detect such incomplete operations. A Berger code is simply the inverted binary encoded Hamming weight of the data, and the Hamming weight is the number of 1-bits in the data. Alternatively, one could also use the binary encoding of the number of 0-bits in the data instead of the inverted Hamming weight. This works because an increasing Hamming weight in this check value would imply an increasing check value which would imply a decreasing Hamming weight of the data, because of the inversion or counting of 0-bits. So, errors where 1-bits could result in 0-bits in memory would imply a lower Hamming weight in the actual data and/or a higher expected Hamming weight by the check value, but the actual and expected Hamming weight could only match if there was no such error at all.

Encoding the data may be accomplished as shown in the following pseudocode:
 1. Encode(data):
 2. return data||~HW(data)
Decoding the data may be accomplished as shown in the following pseudocode:
 1. Decode(data||check):
 2. if (~HW(data)==check): ok, return data
 3. else: error Here "||" means concatenation, "~" means bit-wise inversion or 1-complement, and HW(x) the Hamming weight of x. The number of bits needed for the check value is k=[log$_2$ (m+1)], where m is the number of bits in data. The total length of the encoded data word would then be n=m+k.

Now the actual problem will be discussed, that is the situation where there could also be one arbitrary (symmetric) error (in the other direction) on top of the unidirectional errors. For memory this is usually expected and some ECC is implemented in the memory controller to correct such single errors during reads. Typically, this is a one-error-correcting code, e.g. a Hamming code. Because the combination of multiple unidirectional errors and one arbitrary error cannot be handled by such an ECC, it will most likely result in a mis-correction and hence in another arbitrary error, such that the tearing detection must detect multiple unidirectional errors plus up to two errors in the other direction. For example, if two unidirectional errors and two other errors happen in the data, then the Hamming weight would still be the same and hence could not be detected by any Hamming-weight-based check alone. Thus an additional error detection code (EDC) is needed on top that can at least detect 4-bit errors. This could be a CRC, which needs to be selected according to the data length m. A good source to find the right CRC is the list by Philip Koopman at https://users.ece.cmu.edu/~koopman/crc/. For example if 128 data-bits are being considered, a CRC-16 could be used with polynomial 0x9eb2=$x^{16}+x^{13}+x^{12}+x^{11}+x^{10}+x^8+x^6+x^5+x^2+1$ (0x9eb2; 0x13d65)<=>(0xa6bc; 0x14d79) that has a factor of x+1 in it and hence generates code words (data||crc) with even Hamming weight, which means that the least significant bit of the Hamming weight of such code words can be ignored, because it is always 0. Another way to design such EDCs is to use BCH codes with the desired Hamming distance, which could then also be used as a simple CRC code for error detection only. There are also codes where some additional check- or parity-bits are not simply appended, but use some completely different encoding, which are called non-systematic instead of systematic, e.g. constant-weight codes as 6b/8b or Hadamard.

For these code words the Hamming weight hw is computed and inverted, and the inverted Hamming weight is appended to the data three times. Then the ECC is computed on this concatenation, and the ECC is appended to the concatenation resulting in the encoded data. For reading/checking the encoded data, the ECC must first be handled, and hence the ECC may correct one possible error, which might also be a mis-correction; then the CRC is computed and checked as well as the Hamming weight(s).

Encoding the data may be accomplished as shown in the following pseudocode:
1. Encode(data):
2. crc:=CRC(data)
3. hw:=HW(data||crc)//if HW(data||crc) always even, ignore least significant bit
4. ecc:=ECC(data||crc||~hw||~hw||~hw)
5. return data||crc||~hw||~hw||~hw||ecc The encoding begins by taking the CRC of the data. Then the Hamming weight of the data concatenated with the CRC is determined. In one embodiment, if the Hamming weight is always even, the last significant bit may be ignored. The Hamming weight is inverted and three copies are concatenated to the data and the CRC, and the ECC is applied to this value. Finally, this ECC value is concatenated to the concatenation of the data, CRC, and three copies of the inverted Hamming weight. This is the encoded data that is written to the memory.

Decoding the data may be accomplished as shown in the following pseudocode:

1. Decode(data||crc||~hw||~hw||~hw||ecc):
2.     data'||crc'||~hw'||~hw''||~hw'''||ecc':=decodeECC (data||crc||~hw||~hw||~hw||ecc)
3. check crc'==CRC(data')?
4. check hw'==hw''==hw'''==HW(data'||crc')?
5. if all checks pass: ok, return data'
6. else: error In the pseudocode above x':=ECC(x) means that the error correction algorithm shall be applied to x and the corrected data will be x'. Decoding begins by correcting the received data using the ECC. Next, a CRC is performed on the corrected data and compared to the corrected CRC value. Next, the Hamming weight of the concatenation of the corrected data and CRC value is determined; also three Hamming weight values are determined from the three corrected inverted Hamming weight values. Then the four Hamming weight values are compared. If all the checks pass, then the corrected data data' is returned; otherwise and error is returned.

The following is an explanation of why this works. After the error correction in step 2 of the decoding, there may be multiple unidirectional errors and at most two (symmetric) errors in the other direction. Consider the following different cases:
1. Errors are detected in data'||crc' by the CRC:
   a. Then an error is returned and the tearing has been detected;
2. There is no error in data'||crc':
   a. Then any error in hw or ecc would be detected, because these values are uniquely defined by data'||crc'
      i. Either an error is detected, then the tearing is also detected, or
      ii. No error is present, so there was no tearing; and
3. There are undetected errors in data'||crc':
   a. Then there must be at least 5 errors in data'||crc', because 4 or less errors would have been detected by CRC
   b. Then the Hamming weight of data'||crc' must be lower than of the error-free values, because there can be at most 2 errors in the other direction and hence must be at least 3 unidirectional errors.
   c. To not be detected by the triple ~hw, the Hamming weight of ~hw', ~hw'' and ~hw''' must be higher than the original value, but this would only occur for errors in the other direction, which is not possible
   d. Hence such errors would be detected by the triple ~hw check.

Note that single errors are always corrected and not detected as tearing.

This scheme could also be extended to cases where up to t>1 arbitrary (symmetric) errors could appear plus multiple unidirectional errors, such that an ECC is used to correct up to t errors instead of only one. In such cases, the CRC/EDC must detect all 4t-bit errors and the inverted Hamming weight must be appended 2t+1 times (this is actually also true for t=0,1). So if t=2, then the inverted Hamming weight must be appended 5 times, and if t=3, then the inverted Hamming weight must be appended 7 times, etc.

The described solution with repeating the inverted Hamming weight multiple times is at times not optimal. What is needed is an encoding of the data||crc Hamming weight such that at least 2t+1 bits of this encoding are changing from 1 to 0 if the Hamming weight is increasing. For example, instead of using 3×4=12 bits to encode Hamming weights 0-15 by simply repeating the inverted Hamming weight three times, one could use the following encoding to encode Hamming weights 0-21:

0: 111111111111
   1: 000111111111
   2: 111000111111
   3: 111111000111
   4: 111111111000
   5: 110110110110
   6: 101101101101
   7: 011011011011
   8: 000000111111
   9: 000111000111
   10: 000111111000
   11: 111000000111
   12: 111000111000
   13: 111111000000
   14: 001001001001
   15: 010010010010
   16: 100100100100
   17: 000000000111
   18: 000000111000
   19: 000111000000
   20: 111000000000
   21: 000000000000

Other such encodings may be found to encode the repeated Hamming weights in order to reduce the overhead of adding multiple copies of the inverted Hamming weight when encoding the data to be stored in the memory.

FIG. 1 illustrates an exemplary hardware diagram 100 for implementing a memory encoding and decoding method as described above. Such a device may be part of the memory were the encoded data is stored or may be separate from such memory. As illustrated, the device 100 includes a processor 120, memory 130, user interface 140, network interface 150, and storage 160 interconnected via one or more system buses 110. It will be understood that FIG. 1 constitutes, in some respects, an abstraction and that the actual organization of the components of the device 100 may be more complex than illustrated.

The processor 120 may be any hardware device capable of executing instructions stored in memory 130 or storage 160 or otherwise processing data. As such, the processor may include a microprocessor, microcontroller, graphics processing unit (GPU), field programmable gate array (FPGA), application-specific integrated circuit (ASIC), or other similar devices.

The memory 130 may include various memories such as, for example L1, L2, or L3 cache or system memory. As such, the memory 130 may include static random-access memory (SRAM), dynamic RAM (DRAM), flash memory, read only memory (ROM), or other similar memory devices.

The user interface 140 may include one or more devices for enabling communication with a user as needed. For example, the user interface 140 may include a display, a touch interface, a mouse, and/or a keyboard for receiving user commands. In some embodiments, the user interface 140 may include a command line interface or graphical user interface that may be presented to a remote terminal via the network interface 150.

The network interface 150 may include one or more devices for enabling communication with other hardware devices. For example, the network interface 150 may include a network interface card (NIC) configured to communicate according to the Ethernet protocol or other communications protocols, including wireless protocols. Additionally, the network interface 150 may implement a TCP/IP stack for communication according to the TCP/IP protocols. Various alternative or additional hardware or configurations for the network interface 150 will be apparent.

The storage 160 may include one or more machine-readable storage media such as read-only memory (ROM), random-access memory (RAM), magnetic disk storage media, optical storage media, flash-memory devices, or similar storage media. In various embodiments, the storage 160 may store instructions for execution by the processor 120 or data upon with the processor 120 may operate. For example, the storage 160 may store a base operating system 161 for controlling various basic operations of the hardware 100. The storage 162 may include instructions for implementing the memory encoding and decoding method described above.

It will be apparent that various information described as stored in the storage 160 may be additionally or alternatively stored in the memory 130. In this respect, the memory 130 may also be considered to constitute a "storage device" and the storage 160 may be considered a "memory." Various other arrangements will be apparent. Further, the memory 130 and storage 160 may both be considered to be "non-transitory machine-readable media." As used herein, the term "non-transitory" will be understood to exclude transitory signals but to include all forms of storage, including both volatile and non-volatile memories.

While the host device 100 is shown as including one of each described component, the various components may be duplicated in various embodiments. For example, the processor 120 may include multiple microprocessors that are configured to independently execute the methods described herein or are configured to perform steps or subroutines of the methods described herein such that the multiple processors cooperate to achieve the functionality described herein. Further, where the device 100 is implemented in a cloud computing system, the various hardware components may belong to separate physical systems. For example, the processor 120 may include a first processor in a first server and a second processor in a second server.

Figure 2:
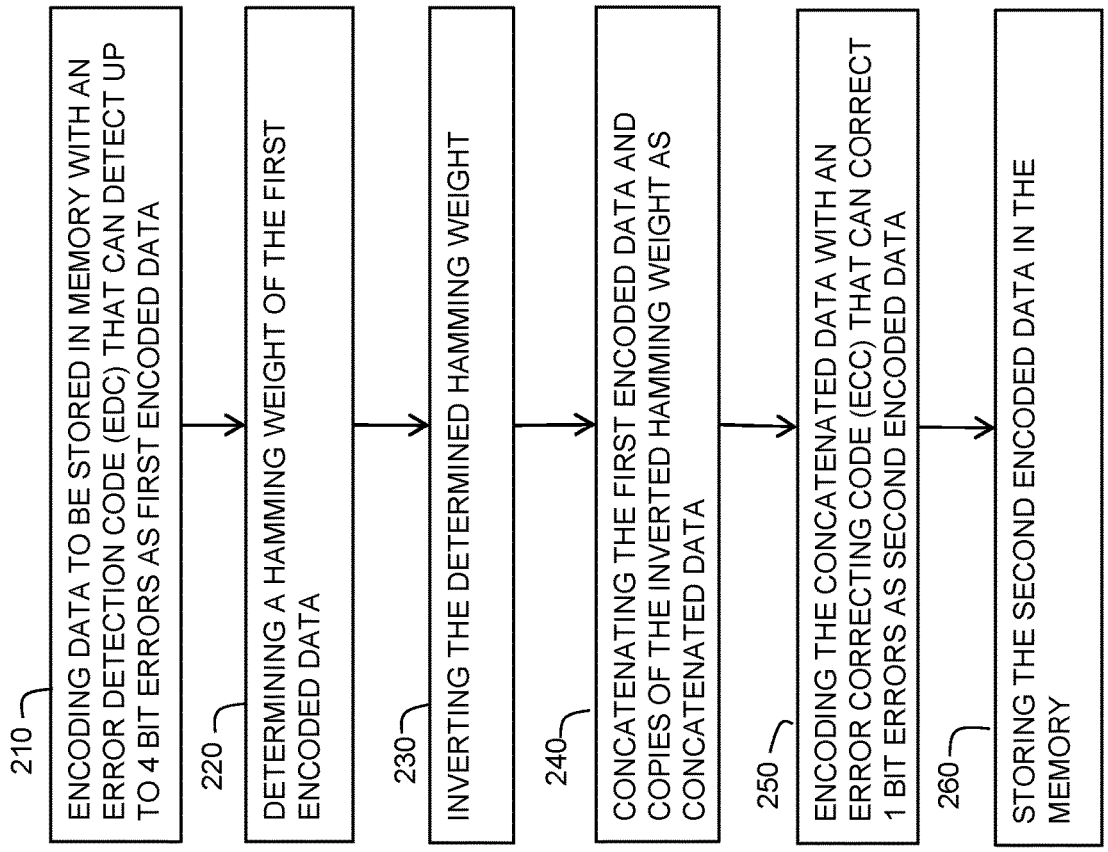
FIG. 2 illustrates a method for encoding data to be stored in a memory in accordance with an embodiment.

FIG. 2 illustrates a method 200 for encoding data to be stored in a memory in accordance with an embodiment. Method 200 begins at step 210. At step 210, data to be stored in a memory is encoded with an error correction code (ECC) that can detect up to 4-bit errors as first encoded data. At step 220, a Hamming weight of the first encoded data is determined. At step 230, the determined Hamming weight is inverted. At step 240, the first encoded data and copies of the inverted Hamming weight are concatenated. At step 250, the concatenated data is encoded with an ECC that can correct 1-bit errors as second encoded data. At step 260, the second encoded data is stored in memory.

In another embodiment, the memory encoding and decoding method described above may be implemented using hardware to implement each of the different encoding and decoding steps. Such specific hardware may be built into the memory where the data is to be stored, and may specifically be part of the memory controller.

Any combination of specific software running on a processor to implement the embodiments of the invention, constitute a specific dedicated machine.

As used herein, the term "non-transitory machine-readable storage medium" will be understood to exclude a transitory propagation signal but to include all forms of volatile and non-volatile memory.

It should be appreciated by those skilled in the art that any block diagrams herein represent conceptual views of illustrative circuitry embodying the principles of the invention.

Although the various exemplary embodiments have been described in detail with particular reference to certain exemplary aspects thereof, it should be understood that the invention is capable of other embodiments and its details are capable of modifications in various obvious respects. As is readily apparent to those skilled in the art, variations and modifications can be affected while remaining within the spirit and scope of the invention. Accordingly, the foregoing disclosure, description, and figures are for illustrative purposes only and do not in any way limit the invention, which is defined only by the claims.

What is claimed is:

1. A method for encoding data to be stored in a memory, comprising:
   encoding the data to be stored in memory with an error detection code (EDC), that can detect up to 4 bit errors, as first encoded data;
   determining Hamming weight of the first encoded data;
   inverting the determined Hamming weight;
   concatenating the first encoded data and three copies of the inverted Hamming weight as concatenated data;
   encoding the concatenated data with an error correcting code (ECC), that can correct 1 bit error, as second encoded data; and
   storing the second encoded data in the memory.

2. The method of claim 1, further comprising concatenating 2(t−1) additional copies of the inverted Hamming weight to the first concatenated data, wherein t is a number of arbitrary errors to be corrected, and wherein the EDC detects 4t bit errors.

3. The method of claim 1, wherein the EDC is a cyclic redundancy code (CRC).

4. The method of claim 1, further comprising encoding the three copies of the inverted Hamming weight before being concatenated to the first encoded data, wherein the encoded inverted Hamming weights have fewer bits than the three copies of the inverted Hamming weight and wherein for all higher Hamming weights the encoding should have at least three bit-positions that change from 1 to 0 per Hamming weight.

5. The method of claim 1, wherein when the Hamming weight is always even, the last significant bit of the Hamming weight is not used.

6. A method for decoding data stored in a memory, comprising:
   reading first encoded data from the memory, wherein the first encoded data includes second encoded data encoded with an error detection code (EDC), that can detect up to 4 bit errors, and first, second, and third inverted Hamming weights;
   decoding the first encoded data using an error correcting code (ECC);
   decoding and checking the second encoded data with the EDC;
   inverting the first, second, and third decoded inverted Hamming weights into first, second, and third Hamming weights;
   determining a fourth Hamming weight of the second encoded data;
   returning the second decoded data if the checking of the second encoded data did not return an error and the first, second, third, and fourth Hamming weights are equal, otherwise returning an error.

7. The method of claim 6, wherein the second encoded data further includes 2(t−1) additional copies of the first, second, and third decoded inverted Hamming weight to a first concatenated data, wherein t is a number of arbitrary errors to be corrected, wherein the EDC detects 4t bit errors.

8. The method of claim 7, wherein the EDC is a cyclic redundancy code (CRC).

9. The method of claim 6, wherein the first, second, and third inverted Hamming weight are encoded, wherein the encoded first, second, and third inverted Hamming weights have fewer bits than the concatenated first, second, and third inverted Hamming weights, further comprising decoding the encoded first, second, and third inverted Hamming weights and wherein for all higher Hamming weights the encoding should have at least three bit-positions that change from 1 to 0 per Hamming weight.

10. The method of claim 6, wherein when Hamming weight is always even, the last significant bit of the Hamming weight is not used.

11. A device configured to encode data stored in a first memory, comprising:
    a second memory;
    a processor coupled to the second memory, wherein the processor is further configured to:
    encode the data to be stored in the first memory with an error detection code (EDC), that can detect up to 4 bit errors, as first encoded data;
    determine Hamming weight of the first encoded data;
    invert the determined Hamming weight;
    concatenate the first encoded data and three copies of the inverted Hamming weight as concatenated data;
    encode the concatenated data with an error correcting code (ECC), that can correct 1 bit error, as second encoded data; and
    store the second encoded data in the first memory.

12. The device of claim 11, wherein the processor is further configured to concatenate 2(t−1) additional copies of the inverted Hamming weight to a first concatenated data, wherein t is a number of arbitrary errors to be corrected, and wherein the EDC detects 4t bit errors.

13. The device of claim 12, wherein the EDC is a cyclic redundancy code (CRC).

14. The device of claim 11, wherein the processor is further configured to encode the three copies of the inverted Hamming weight before being concatenated to the first encoded data, wherein the encoded inverted Hamming weights have fewer bits than the three copies of the inverted Hamming weight and wherein for all higher Hamming weights the encoding should have at least three bit-positions that change from 1 to 0 per Hamming weight.

15. The device of claim 11, wherein when the Hamming weight is always even, the last significant bit of the Hamming weight is not used.

16. A device configured to decode data stored in a first memory, comprising:
    a second memory;
    a processor coupled to the second memory, wherein the processor is further configured to:
    read first encoded data from the first memory, wherein the first encoded data includes second encoded data encoded with an error detection code (EDC), that can detect up to 4 bit errors, and a first, second, and third inverted Hamming weights;
    decode the first encoded data using an error correcting code (ECC);
    decode and checking the second encoded data with the EDC;
    invert the first, second, and third decoded inverted Hamming weights into first, second, and third Hamming weights;

determine a fourth Hamming weight of the second encoded data;

return the second decoded data if the checking of the second encoded data did not return an error and the first, second, third, and fourth Hamming weights are equal, otherwise returning an error.

17. The device of claim 16, wherein the second encoded data further includes 2(t−1) additional copies of the first, second, and third inverted Hamming weight to a first concatenated data, wherein t is a number of arbitrary errors to be corrected, wherein the EDC detects 4t bit errors.

18. The device of claim 17, wherein the EDC is a cyclic redundancy code (CRC).

19. The device of claim 16, wherein the first, second, and third inverted Hamming weight are encoded, wherein the encoded first, second, and third inverted Hamming weights have fewer bits than a concatenated first, second, and third inverted Hamming weights, further comprising decoding encoded first, second, and third inverted Hamming weights and wherein for all higher Hamming weights the encoding should have at least three bit-positions that change from 1 to 0 per Hamming weight.

20. The device of claim 16, wherein when Hamming weight is always even, the last significant bit of the Hamming weight is not used.

* * * * *